United States Patent
Wada et al.

(10) Patent No.: US 12,187,943 B2
(45) Date of Patent: Jan. 7, 2025

(54) CHEMICAL SOLUTION USED FOR CLEANING OR ETCHING RUTHENIUM-CONTAINING LAYER AND METHOD FOR FABRICATING RUTHENIUM WIRING

(71) Applicant: TOKYO OHKA KOGYO CO., LTD., Kawasaki (JP)

(72) Inventors: Yukihisa Wada, Kawasaki (JP); Shinya Koga, Kawasaki (JP); Kazuhiro Takahashi, Kawasaki (JP)

(73) Assignee: TOKYO OHKA KOGYO CO., LTD., Kawasaki (JP)

( * ) Notice: Subject to any disclaimer, the term of this patent is extended or adjusted under 35 U.S.C. 154(b) by 426 days.

(21) Appl. No.: 17/574,974

(22) Filed: Jan. 13, 2022

(65) Prior Publication Data

US 2022/0243127 A1    Aug. 4, 2022

(30) Foreign Application Priority Data

Feb. 3, 2021    (JP) .................................. 2021-015480

(51) Int. Cl.
| | |
|---|---|
| *C09K 13/00* | (2006.01) |
| *C11D 1/75* | (2006.01) |
| *C11D 3/04* | (2006.01) |
| *C11D 3/20* | (2006.01) |
| *C11D 3/28* | (2006.01) |
| *C11D 3/30* | (2006.01) |
| *C11D 3/36* | (2006.01) |
| *H05K 3/10* | (2006.01) |

(52) U.S. Cl.
CPC ................ *C09K 13/00* (2013.01); *C11D 1/75* (2013.01); *C11D 3/044* (2013.01); *C11D 3/2079* (2013.01); *C11D 3/28* (2013.01); *C11D 3/30* (2013.01); *C11D 3/361* (2013.01); *H05K 3/107* (2013.01); *C11D 2111/20* (2024.01); *Y10T 29/49155* (2015.01)

(58) Field of Classification Search
CPC ...... C09K 13/00; C09K 13/06; C07D 277/82; H01L 21/02074; H05K 3/107; Y10T 29/49155
USPC ........................... 29/846, 745, 825, 829, 852
See application file for complete search history.

(56) References Cited

U.S. PATENT DOCUMENTS

| | | | |
|---|---|---|---|
| 2012/0256122 A1 | 10/2012 | Sato et al. | |
| 2017/0222138 A1* | 8/2017 | Park | ............ C23F 4/00 |
| 2019/0385906 A1 | 12/2019 | Aizawa et al. | |
| 2022/0119960 A1* | 4/2022 | Mizutani | ............ C11D 7/32 |

FOREIGN PATENT DOCUMENTS

| | | |
|---|---|---|
| JP | 2019-220690 A | 12/2019 |
| JP | 2020-087945 A | 6/2020 |
| WO | WO 2011/074601 A1 | 6/2011 |
| WO | WO 2020/123126 A1 | 6/2020 |
| WO | WO 2021/005980 A1 | 1/2021 |

* cited by examiner

*Primary Examiner* — Thiem D Phan
(74) *Attorney, Agent, or Firm* — Knobbe, Martens, Olson & Bear, LLP

(57) ABSTRACT

A chemical solution used for cleaning or etching a ruthenium-containing layer, which can obtain the ruthenium-containing layer having a reduced surface roughness while maintaining a good etching rate against the ruthenium, and a method for fabricating ruthenium wiring. The chemical solution includes orthoperiodic acid, a base component, and any one of a nitrogen-containing heterocyclic compound, an organic phosphonic acid, and an organic carboxylic acid.

11 Claims, No Drawings

CHEMICAL SOLUTION USED FOR CLEANING OR ETCHING RUTHENIUM-CONTAINING LAYER AND METHOD FOR FABRICATING RUTHENIUM WIRING

RELATED APPLICATION

This application claims priority to Japanese Patent Application No. 2021-015480, filed Feb. 3, 2021, the entire content of which is incorporated herein by reference.

BACKGROUND OF THE INVENTION

Field of the Invention

The present invention relates to a chemical solution used for cleaning or etching a ruthenium-containing layer and a method for fabricating ruthenium wiring.

Related Art

In a front-end process of fabricating semiconductor devices, a process of forming metal wiring on a wafer surface includes MOL (Middle of the Line) and BEOL (Back End of the Line). In the MOL, a plug is formed; and in the BEOL, the metal wiring, vias, etc. are formed. Recently, in fabrication of semiconductor devices and liquid crystal display devices, pattern miniaturization is rapidly progressing due to advances in lithography technology. As wiring patterns become finer and finer, it becomes more difficult to sufficiently allow alignment margins, resulting in problems such as resistance fluctuation and deterioration of reliability.

As a measure to ensure the alignment margins, a technique has been developed to, after CMP (chemical mechanical polishing), selectively etch (recess) the metal wiring so that the wiring recedes, which is called FSAV (Fully Self Aligned Via) (e.g., Patent Literature 1).

Copper, tungsten, cobalt, etc. have been used as wiring materials; however, as patterns become finer, the use of ruthenium, which has a smaller resistance, has been considered. In the case of forming ruthenium wiring by applying the FSAV, a chemical solution suitable for recess formation has been demanded.

Further, in the BEOL, a conventional Dual Damascene structure, in which copper is used for a metal wiring material, has problems with patterning variation and resistance rise approaching a limit. Therefore, a Semi-Damascene structure using ruthenium, which is a low resistance metal, has been proposed.

When forming the above Semi-Damascene structure, dry etching is performed on a ruthenium layer formed on a surface of a substrate. When dry etching is performed, reaction products (hereinafter sometimes referred to as "ruthenium residue" simply) of ruthenium and etching gas may form on a surface of the ruthenium layer and on other surface exposed films. Therefore, also demanded has been a chemical solution which can clean and remove the above ruthenium residue formed by the dry etching.

As a method for etching ruthenium, for example, an etching method using an etching solution, which contains orthoperiodic acid as an oxidant and has a pH of 8 or more, has been proposed (Patent Literature 2). However, when etching of ruthenium is performed by using the etching solution described in Patent Literature 2, intergranular corrosion occurs, and roughness control may be difficult.

Patent Document 1: Japanese Unexamined Patent Application, Publication No. 2019-220690
Patent Document 2: Japanese Unexamined Patent Application, Publication No. 2020-087945

SUMMARY OF THE INVENTION

The present invention has been made in consideration of above circumstances, and an object of the present invention is to provide a chemical solution used for cleaning or etching a ruthenium-containing layer, which can obtain the ruthenium-containing layer having a reduced surface roughness while maintaining a good etching rate against the ruthenium, and a method for fabricating ruthenium wiring using the chemical solution.

The present inventors have found that, in a chemical solution containing orthoperiodic acid and a base component, the problem described above can be solved by further blending a compound (C) selected from the group consisting of a nitrogen-containing heterocyclic compound, an organic phosphonic acid, and an organic carboxylic acid, and have made the present invention.

A first aspect of the present invention is a chemical solution for use in cleaning or etching a ruthenium-containing layer, comprising:
  orthoperiodic acid (A);
  a base component (B); and
  a compound (C) selected from the group consisting of a
    nitrogen-containing heterocyclic compound, an organic
    phosphonic acid, and an organic carboxylic acid,
  provided that the base component (B) does not correspond
    to any one of the compound (C), a pH buffer component (D), and an organic amine oxide (E).

A second aspect of the present invention is a method for fabricating ruthenium wiring, comprising:
  a step of forming, on a substrate, an insulating film having
    a trench;
  a step of forming a ruthenium-containing layer using a
    ruthenium-containing conductive material so as to fill
    the trench;
  step of flattening each of surfaces of the ruthenium-
    containing layer and the insulating film; and
  a step of forming a recess by etching the flattened surface
    of the ruthenium-containing layer using the chemical
    solution according to the first aspect.

According to the present invention, provided can be a chemical solution used for cleaning or etching a ruthenium-containing layer, which can obtain the ruthenium-containing layer having a reduced surface roughness while maintaining a good etching rate against the ruthenium, and a method for fabricating ruthenium wiring using the chemical solution.

DETAILED DESCRIPTION OF THE INVENTION

<Chemical Solution>

A chemical solution contains orthoperiodic acid (A), a base component (B), and a compound (C) selected from the group consisting of a nitrogen-containing heterocyclic compound, an organic phosphonic acid, and an organic carboxylic acid.

The chemical solution is used for cleaning or etching a ruthenium-containing layer.

By using the chemical solution, the ruthenium-containing layer having a reduced surface roughness while maintaining a good etching rate against the ruthenium can be obtained.

(Orthoperiodic Acid (A))

Ruthenium is changed to ruthenium tetroxide ($RuO_4$) by combining with four oxygen atoms. The orthoperiodic acid (A) ($H_5IO_6$) is an oxidant which emits oxygen atoms to oxidize the ruthenium. Oxygen-reduction potential of the orthoperiodic acid (A) is sufficiently high to oxidize the ruthenium. Therefore, the orthoperiodic acid (A) can efficiently oxidize and dissolve the ruthenium, i.e., etch the ruthenium.

A content of the orthoperiodic acid (A) is, e.g., 0.01 to 8% by mass, preferably 0.02 to 7% by mass, and more preferably 0.03 to 5% by mass, based on the total mass of the chemical solution. When the content of the orthoperiodic acid (A) is within the above range, the etching rate against the ruthenium is more improved.

(Base Component (B))

The base component (B) is a component that adjusts a pH of the chemical solution in a desired range. As the base component (B), any of an organic base component and an inorganic base component can be used. Preferred examples of the organic base component include: quaternary ammonium salts such as organic quaternary ammonium hydroxides; alkanolamines; other organic amines except for alkanolamines, such as a primary amine, a secondary amine, and a tertiary amine. The base component (B) is a component not corresponding to any of the compound (C), a pH buffer component (D), or an organic amine oxide (E), described later.

Examples of the organic quaternary ammonium hydroxides include tetramethylammonium hydroxide, bis(2-hydroxyethyl) dimethylammonium hydroxide, tetraethylammonium hydroxide, tetrapropylammonium hydroxide, tetrabutylammonium hydroxide, methyltriethylammonium hydroxide, trimethyl(hydroxyethyl) ammonium hydroxide, and triethyl(hydroxyethyl) ammonium hydroxide.

Examples of the alkanolamines include monoethanolamine, diethanolamine, monoisopropanolamine, diisopropanolamine, methylethanolamine, N-methylethanolamine, and aminoethylethanolamine.

Examples of other organic amines include diazabicycloundecene.

Examples of the inorganic basic compounds include inorganic compounds and their salts including ammonia, an alkali metal, or an alkaline earth metal. Specific examples of the inorganic compounds and their salts, including the alkali metal or the alkaline earth metal include lithium hydroxide, sodium hydroxide, potassium hydroxide, rubidium hydroxide, and cesium hydroxide.

As the base component (B), one type may be used alone or two types may be used in combination. A content of the base component (B) is preferably 0.01% by mass or more and 20% by mass or less, and more preferably 0.1% by mass or more and 10% by mass or less, based on the total mass of the chemical solution.

(Compound (C))

The compound (C) is selected from the group consisting of a nitrogen-containing heterocyclic compound, an organic phosphonic acid, and an organic carboxylic acid. Among these compounds, from a point of view that an increase in roughness is greatly reduced, the nitrogen-containing heterocyclic compound is preferable.

The nitrogen-containing heterocyclic compound is a compound containing a nitrogen-containing heterocyclic ring. Examples of the nitrogen-containing heterocyclic ring include a triazole ring, an imidazole ring, a pyridine ring, a phenanthroline ring, a tetrazole ring, a pyrazole ring, and a pyrimidine ring. Further, as the nitrogen-containing heterocyclic compound, any of a compound composed of any of these nitrogen-containing heterocyclic rings and a compound in which any of these nitrogen-containing heterocyclic rings is bonded to one or more of other rings, can be also used.

Examples of the compounds containing the triazole ring include triazoles and benzotriazoles. Examples of the triazoles include 1,2,3-triazole, 1,2,4-triazole, 3-amino-1H-1,2,4-triazole, 1-acetyl-1H-1,2,3-triazolo[4,5-b]pyridine, 1H-1,2,3-triazolo[4,5-b]pyridine, 1,2,4-triazolo[4,3-a]pyridin-3(2H)-one, and 3H-1,2,3-triazolo[4,5-b]pyridin-3-ol. Examples of the benzotriazoles include 1,2,3-benzotriazole, 5-methyl-1H-benzotriazole, 1-hydroxybenzotriazole, 1-dihydroxypropylbenzotriazole, 2,3-dicarboxypropylbenzotriazole, 4-hydroxybenzotriazole, 4-carboxyl-1H-benzotriazole, 4-carboxyl-1H-benzotriazole methyl ester, 4-carboxyl-1H-benzotriazole butyl ester, 4-carboxyl-1H-benzotriazole octyl ester, 5-hexylbenzotriazole, [1,2,3-benzotoriazolyl-1-methyl][1,2,4-triazolyl-1-methyl][2-ethylhexyl]amine, tolyltriazole, naphthotriazole, bis[(1-benzotoriazolyl)methyl]phosphonic acid, and 3-aminotoriazole. Among these compounds, the 1,2,3-benzotoriazole and the 5 methyl-1H-benzotoriazole are preferable.

Examples of the compounds containing the imidazole ring include imidazoles and biimidazoles. Examples of the imidazoles include 2-methylimidazole, 2-ethylimidazole, 2-isopropylimidazole, 2-propylimidazole, 2-butylimidazole, 4 methylimidazole, 2,4-dimethylimidazole, 2-ethyl-4-methylimidazole, 2-undecylimidazole, and 2-aminoimidazole. Examples of the biimidazoles include 2,2'-biimidazole.

Examples of the compounds containing the pyridine ring include pyridines and bipyridines. Examples of the pyridines include 1H-1,2,3-triazolo[4,5-b]pyridine, 1-acetyl-1H-1,2,3-triazolo[4,5-b]pyridine, 3-aminopyridine, 4-aminopyridine, 3-hydroxypyridine, 4-hydroxypyridine, 2-acetamidepyridine, 4-pyrrolidinopyridine, and 2-cyanopyridine. Examples of the bipyridines include 2,2'-bipyridyl, 2,2'-bipyridine-4,4'-dicarboxylic acid, 4,4'-dimethyl-2,2'-bipyridyl, 4,4'-di-tert-butyl-2,2'-bipyridyl, and 4,4-dinonyl-2,2-bipyridyl.

Among these compounds, from a point of view of easy to improve preservation stability of the chemical solution, the bipyridyls are preferable, and the 2,2'-bipyridyl and the 2,2'-bipyridine-4,4'-dicarboxylic acid are more preferable.

Examples of the compounds containing the phenanthroline ring include 1,10-phenanthroline.

Examples of the compounds containing the tetrazole ring include 1H-tetrazole, 5-amino-1H-tetrazole, 5-methyl-1H-tetrazole, 5-phenyl-1H-tetrazole, and 1-(2-diaminoethyl)-5-mercaptotetrazole.

Examples of compounds containing the pyrazole ring include 3,5-dimetylpyrazole, 3-amino-5-methylpyrazole, 4-methylpyrazole, and 3-amino-5-hydroxypyrazole.

Examples of compounds containing the pyrimidine ring include pyrimidine, 1,2,4-triazolo[1,5-a]pyrimidine, 1,3,4,6,7,8-hexahydro-2H-pyrimido[1,2-a]pyrimidine, 1,3-diphenyl-pyrimidine-2,4,6-trione, 1,4,5,6-tetrahydropyrimidine, 2,4,5,6-tetraaminopyrimidinesulfate, 2,4,5-trihydroxypyrimidine, 2,4,6-triaminopyrimidine, 2,4,6-trichloropyrimidine, 2,4,6-trimethoxypyrimidine, 2,4,6-triphenylpyrimidine, 2,4-diamino-6-hydroxylpyrimidine, 2,4-diaminopyrimidine, 2-acetamidopyrimidine, 2-aminopyrimidine, 2-methyl-5,7-diphenyl-(1,2,4)triazolo (1,5-a)pyrimidine, 2-methylsulfonyl-5,7-diphenyl-(1,2,4) triazolo(1,5-a)pyrimidine, 2-methylsulfonyl-5,7-diphenyl-4,7-dihydro-(1,2,4)triazolo(1,5-a)pyrimidine, and 4-aminopyrazolo[3,4-d]pyrimidine.

The organic phosphonic acid is a compound represented by the following formula (a1):

 (a1)

wherein $R^1$ is an aliphatic hydrocarbon group or an aromatic hydrocarbon group.

In the organic phosphonic acid represented by formula (a1), it is preferable that the aliphatic hydrocarbon group of $R^1$ is an aliphatic hydrocarbon group having carbon atoms of 1 or more and 18 or less. The aliphatic hydrocarbon group may be linear or branched chain. In the organic phosphonic acid represented by formula (a1), it is preferable that the aromatic hydrocarbon group of $R^1$ is an aromatic hydrocarbon group having carbon atoms of 6 or more and 12 or less.

Preferred examples of the linear or branched chain aliphatic hydrocarbon group having carbon atoms of 1 or more and 18 or less of as $R^1$ include a methyl group, an ethyl group, a n-propyl group, an isopropyl group, a n-butyl group, a sec-butyl group, an isobutyl group, a tert-butyl group, n-pentyl group, an isopentyl group, a neopentyl group, a cyclopentyl group, a n-hexyl group, 2-ethylhexyl group, a cyclohexyl group, a n-heptyl group, a cycloheptyl group, a n-octyl group, a cyclooctyl group, a n-nonyl group, a n-decyl group, a n-undecyl group, a n-dodecyl group, and a n-octadecyl group.

Preferred examples of the aromatic hydrocarbon group having carbon atoms of 6 or more and 12 or less of as $R^1$ include a phenyl group, a 2-methylphenyl group, a 3-methylphenyl group, a 4-methylphenyl group, a 2-ethylphenyl group, a 3-ethylphenyl group, a 4-ethylphenyl group, a α-naphthyl group, a β-naphthyl group, and a biphenyl group.

In the aliphatic hydrocarbon groups and the aromatic hydrocarbon groups described above, n-butyl group, n-hexyl group, cyclohexyl group, n-octyl group, n-decyl group, and phenyl group are preferable.

Specific examples of the phosphonic acid represented by formula (a1) include n-butylphosphonic acid, n-hexylphosphonic acid, n-octylphosphonic acid, n-decylphosphonic acid, and n-octadecylphosphonic acid.

The organic carboxylic acids are carboxylic acids having a saturated or unsaturated aliphatic hydrocarbon group. Examples of the organic carboxylic acids include formic acid, acetic acid, propionic acid, butyric acid, valerianic acid, n-heptanoic acid, lauric acid, palmitic acid, stearic acid, acrylic acid, oleic acid, oxalic acid, malonic acid, maleic acid, fumaric acid, citraconic acid, succinic acid, adipic acid, citric acid, and tartaric acid.

As the compound (C), one type may be used alone or two types may be used in combination.

A content of the compound (C) is preferably 0.001% by mass or more and 10% by mass or less, and more preferably 0.001% by mass or more and 1% by mass or less, based on the total mass of the chemical solution.

(Other Components)

The chemical solution may contain other components in addition to the components described above to the extent that effects of the present invention are not impaired. Examples of the other components include water, the pH buffer component (D), the organic amine oxide (E), and a surfactant.

It is preferable that the chemical solution contains water as a solvent. As the water, preferable is water that is subjected to purification treatment, such as distilled water, ion exchanged water, and ultrapure water, and more preferable is the ultrapure water which is generally used for the fabrication of semiconductor.

A content of the water is not limited, and is preferably 50% by mass or more, more preferably 80% by mass or more, based on the total mass of the chemical solution. Also, an upper limit value is not limited, and is preferably less than 99.95% by mass, more preferably 99.9% by mass or less.

The pH buffer component (D) is a component having a function which suppresses a rapid change of the pH of the chemical solution. By containing the pH buffer component (D) in the chemical solution, it is possible to suppress a shift of the pH of the chemical solution to an acidic side and suppress a variation of the etching rate against the ruthenium even when the chemical solution has been stirred for a long time.

Examples of the pH buffer component (D) include citrates, acetates, phosphates, borates, carbonates, bicarbonates, and sulfates.

Specific examples of the pH buffer component (D) include tri-ammonium citrate, ammonium phosphate, ammonium acetate, ammonium sulfate, and ammonium hydrogen carbonate.

As the pH buffer compound (D), one type may be used alone or two types may be used in combination.

A content of the pH buffer component (D) is preferably 0.001% by mass or more and 1% by mass or less, and more preferably 0.01% by mass or more and 0.8% by mass or less, based on the total mass of the chemical solution.

By containing the organic amine oxide (E) in the chemical solution, improvement of wettability of the chemical solution to the ruthenium-containing layer can be expected.

Examples of the organic amine oxide (E) include oxides of an aliphatic amine, and oxides of a cyclic amine. Examples of the oxides of the aliphatic amine include trimethylamine N-oxide, and triethylamine N-oxide. Examples of the oxides of the cyclic amine include N-methylmorpholine N-oxide, pyridine N-oxide, 2,6-dimethylpyridine N-oxide, and 4-(dimethylamino)pyridine N-oxide.

As the organic amine oxide (E), one type may be used alone or two types may be used in combination.

A content of the organic amine oxide (E) is preferably 0.01% by mass or more, and more preferably 0.05% by mass or more and 20% by mass or less, based on the total mass of the chemical solution.

The pH of the chemical solution is not limited, and is, for example, preferably 8 or more and 12 or less, and more preferably 8 or more and 11 or less at a temperature of 20° C. from a point of view of maintaining a good etching rate.

(Method for Producing Chemical Solution)

The chemical solution is obtained by blending the above described orthoperiodic acid (A), the base component (B), the compound (C), and other components as needed, by a known method.

(Use)

The chemical solution is used for cleaning or etching the ruthenium-containing layer. More specifically, the chemical solution is used for cleaning or etching the ruthenium-containing layer on a substrate as an object to be treated in the fabrication of semiconductor devices.

(Object to be Treated)

Examples of the object to be treated which is an object for cleaning treatment or etching treatment include a substrate after which is subjected to dry etching or chemical mechanical polishing on the ruthenium-containing layer positioned on the outermost surface of the substrate.

The substrate which is subjected to the above dry etching or the chemical mechanical polishing has the ruthenium-containing layer on the outermost surface. A method for forming of the ruthenium-containing layer on the substrate is not limited, and known methods can be used, including PVD (Physical Vapor Deposition) such as sputtering, CVD (Chemical Vapor Deposition), and ALD (Atomic Layer Deposition).

Steps of performing the dry etching or the chemical mechanical polishing on the above substrate are not limited, and include preferably a step of forming a metal wiring pattern on the substrate using the ruthenium as a metal wiring material by a Semi-Damascene method or a FSAV method, a step of further forming contact wiring in MOL, and a step of forming a buried power rail.

(Cleaning Treatment, Etching Treatment)

To perform cleaning treatment or etching treatment by using the chemical solution, the ruthenium-containing layer of the above object to be treated is brought into contact with the chemical solution. A method for bringing the ruthenium-containing layer of the above object to be treated into contact with the chemical solution is not limited, and includes known methods. Examples of such methods include a spray method, an immersion method, and a liquid filling method, but not limited to these methods.

In the spray method, for example, by carrying the object to be treated to the predetermined direction or rotating, and spraying the above chemical solution to the object to be treated which is carried or rotated, the object to be treated is brought into contact with the above chemical solution.

In the immersion method, by immersing the object to be treated in the above chemical solution, the object to be treated is brought into contact with the above chemical solution.

In the liquid filling method, by filling the above chemical solution on the object to be treated, the object to be treated is brought into contact with the above chemical solution.

These treatment methods can be appropriately selected depending on a structure and a material of the object to be treated. In the case of the spray method or the liquid filling method, a supplying amount of the above chemical solution to the object to be treated may be sufficient for the amount which a surface to be treated of the object is sufficiently wet with the above chemical solution.

Specific examples of the cleaning treatment include a cleaning treatment of ruthenium residues formed on the surface of the ruthenium layer, after the dry etching of the ruthenium layer, when forming the ruthenium containing wiring by the Semi-Damascene method.

Specific examples of the etching treatment include a recess etching treatment of the ruthenium containing wiring arranged on the substrate, when forming the ruthenium containing wiring by the FSAV method. Here, "the recess etching treatment" means a treatment which forms a recess in the arrangement parts of the ruthenium containing wiring on the substrate by etching treatment of the ruthenium containing wiring arranged on the substrate (fabricating the ruthenium containing wiring having a recess).

A treatment temperature is not limited, and is preferably 15° C. or more and 85° C. or less, and more preferably 20° C. or more and 70° C. or less. Also, a cleaning treatment time is not limited, and is preferably 30 seconds or more and 30 minutes or less, and more preferably 1 minute or more and 10 minutes or less.

<Method for Fabricating Ruthenium Wiring>

A method for fabricating ruthenium wiring comprises: a step of forming, on a substrate, an insulating film having a trench;
    a step of forming a ruthenium-containing layer using a ruthenium-containing conductive material so as to fill the trench;
    a step of flattening each of surfaces of the ruthenium-containing layer and the insulating film; and
    a step of forming a recess by etching the flattened surface of the ruthenium-containing layer using the chemical solution described above.

The method for fabricating the ruthenium wiring is a method for fabricating the ruthenium wiring to which the FSAV described above is applied.

(Step of Forming, on Substrate, Insulating Film Having Trench)

Examples of the substrate include a semiconductor substrate on which one or a plurality of treated semiconductor layers are formed. Examples of the insulating film include an oxide film and a Low-k layer. The insulating film can be formed of SiOCH, a doped silicon dioxide, a spin-on polymer (containing an organic and silicon-based polymer), a porous oxide, etc. The trench can be formed by a known etching method, etc.

(Step of Forming Ruthenium-Containing Layer)

The ruthenium-containing layer is formed by using a ruthenium-containing conductive material so as to fill the above trench. Further, it is preferable that the ruthenium-containing layer is formed after providing a barrier layer or a liner layer on the surfaces of the above insulating film and the above trench. The forming method of the ruthenium-containing layer is not limited, and a known film deposition method such as a CVD method can be used. The barrier layer or the liner layer can be formed of, e.g., titanium nitride (TiN).

(Step of Flattening)

The ruthenium-containing layer and the above insulating film are polished by the chemical mechanical polishing, etc. until the surface of the insulating film is exposed, to flatten each surface.

(Step of Forming Recess)

Using the chemical solution described above, the above flattened surface of the above ruthenium-containing layer is etched to form a recess having a desired depth. The depth of the recess is not limited, and can be, e.g., 1 to 20 nm. This allows formation of the ruthenium wiring using the ruthenium-containing layer.

EXAMPLES

Hereinafter, the present invention will be described in more detail based on examples and comparative examples, but the present invention is not limited to the following examples.

Examples 1 to 23 and Comparative Example 1

(Preparation of Chemical Solution)

By uniformly blending the orthoperiodic acid (A), the following compound (C), the following pH buffer component (D), and the following organic amine oxide (E) into water by the content described in the following Table 1, and further adding the following base component (B), prepared were chemical solutions of Examples 1 to 23 and Comparative Example 1 in which the pH is adjusted to 9 to 9.5.

As the base component (B), the following B1 was used.
B1: ammonia
As the compound (C), the following C1 to C8 were used.
C1: 1,2,3-benzotriazole
C2: 5-methyl-1H-benzotriazole,
C3: 2,2'-bipyridyl
C4: 2,2'-bipyridine-4,4'-dicarboxylic acid
C5: 1,2,4-triazole C6: n-butylphosphonic acid
C7: n-octylphosphonic acid
C8: n-heptanoic acid As the pH buffer component (D), the following D1 to D3 were used.
D1: triammonium citrate
D2: ammonium acetate
D3: ammonium sulfate As the organic amine oxide (E), the following E1 was used.
E1: N-methylmorpholine N-oxide (Fabrication of Test Substrates)

A CVD-Ru substrate deposited by a CVD method (a film thickness of Ru: 30 nm) was cut into 2 cm×2 cm squares, to fabricate test substrates.

(Measurement of Etching Rate)

Each of the chemical solutions of Examples 1 to 23 and Comparative Example 1 was put in a beaker; and each test substrate was immersed in each chemical solution and subjected to chemical solution treatment at 23° C. for 5 minutes while stirring each chemical solution at 300 rpm. Each substrate after the above chemical solution treatment was rinsed, and dried by a nitrogen gas stream.

On the test substrates after the above chemical solution treatment, film thicknesses of Ru were measured by fluorescent X-ray analysis. On the test substrates before the above chemical solution treatment also, film thicknesses of Ru were measured. From the film thicknesses of Ru before and after the chemical solution treatment, the etching rates of Ru (Å/min) were calculated. The results are shown in Table 1 as "ER".

(Measurement of Increase in Roughness)

Each of the chemical solutions of Examples 1 to 23 and Comparative Example 1 was put in a beaker; and each test substrate was immersed in each chemical solution and subjected to chemical solution treatment at 23° C. while stirring each chemical solution at 300 rpm. With respect to a treatment time, from an etching rate of each chemical solution obtained by the above measurement of the etching rate, the treatment time of each chemical solution was set so that an etching amount of Ru film was 10 nm. Each substrate after the above chemical solution treatment was rinsed, and dried by a nitrogen gas stream.

Surfaces of the test substrate before and after the above chemical solution treatment were observed by AFM (Atomic Force Microscope: Dimension Icon, manufactured by Bruker Corporation) to measure a root mean square surface roughness (surface roughness) Rq (nm) per 1 μm square (the measurement area: 2 μm×2 μm). By the following expression, an increase in roughness of the test substrate due to the chemical solution treatment was calculated and evaluated under the following standard. This is shown in Table 1 as "Increase in roughness".

Increase in roughness $(X)$=Rq (nm) after the chemical solution treatment−Rq (nm) before the chemical solution treatment.

Evaluation Standard:
A: $X \leq 0.5$ nm;
B: $0.5$ nm$<X \leq 1.0$ nm; and
C: $1.0$ nm$<X$.

(Measurement of Rate Fluctuation Due to Stirring)

Each of the chemical solutions of Examples 1 to 23 and Comparative Example 1 was put in a beaker, and stirred at 23° C. for 3 hours and at 300 rpm. The pHs of the chemical solution before and after the stirring were measured.

Each test substrate was immersed in the chemical solution after the above stirring and subjected to the chemical solution treatment at 23° C. for 5 minutes while stirring each chemical solution at 300 rpm. Each substrate after the above chemical solution treatment was rinsed, and dried by a nitrogen gas stream. On the test substrates after the above chemical solution treatment, film thicknesses of Ru were measured by the fluorescent X-ray analysis. On the test substrates before the above chemical solution treatment also, film thicknesses of Ru were measured. From the film thicknesses of Ru before and after the chemical solution treatment, the etching rates of Ru (Å/min) were calculated.

Stability of each chemical solution was evaluated under the following standard. This is shown in Table 1 as "Rate Fluctuation due to Stirring".
A: Fluctuation of the etching rate is less than 10%.
B: Fluctuation of the etching rate is 10% or more and less than 20%.
C: Fluctuation of the etching rate is 20% or more.

(Measurement of Shelf Life)

Each of the chemical solutions of Examples 1 to 23 and Comparative Example 1 was put in a bottle made of PFA of 100 ml; after leaving at a room temperature for 30 days, each chemical solution was put in a beaker; and each test substrate was immersed in each chemical solution and subjected to chemical solution treatment at 23° C. for 5 minutes while stirring each chemical solution at 300 rpm. Each substrate after the above chemical solution treatment was rinsed, and dried by a nitrogen gas stream.

On the test substrates after the above chemical solution treatment, film thicknesses of Ru were measured by the fluorescent X-ray analysis. On the test substrates before the above chemical solution treatment also, film thicknesses of Ru were measured. From the film thicknesses of Ru before and after the chemical solution treatment, the etching rates of Ru (Å/min) were calculated.

Stability of each chemical solution was evaluated under the following standard. This is shown in Table 1 as "Shelf Life".
A: Fluctuation of the etching rate is less than 10%.
B: Fluctuation of the etching rate is 10% or more and less than 20%.
C: Fluctuation of the etching rate is 20% or more.

TABLE 1

|  | Orthoperiodic acid (A) % by mass | Base component (B) Type | Compound (C) Type/ % by mass | pH buffer component (D) Type/ % by mass | Organic amine oxide (E) Type/ % by mass | ER (Å/min) | Increase in roughness | Rate fluctuation due to stirring | Shelf life |
|---|---|---|---|---|---|---|---|---|---|
| Comparative Example 1 | 0.8 | B1 | — | — | — | 20 | C | C | A |
| Example 1 | 0.8 | B1 | C1/0.04 | — | — | 11 | A | C | C |
| Example 2 | 0.8 | B1 | C2/0.04 | — | — | 11 | A | C | C |
| Example 3 | 0.8 | B1 | C3/0.04 | — | — | 17 | A | C | A |

TABLE 1-continued

| | Orthoperiodic acid (A) % by mass | Base component (B) Type | Compound (C) Type/ % by mass | pH buffer component (D) Type/ % by mass | Organic amine oxide (E) Type/ % by mass | ER (Å/min) | Increase in roughness | Rate fluctuation due to stirring | Shelf life |
|---|---|---|---|---|---|---|---|---|---|
| Example 4 | 0.8 | B1 | C4/0.04 | — | — | 14 | A | C | A |
| Example 5 | 0.8 | B1 | C5/0.01 | — | — | 14 | A | C | C |
| Example 6 | 0.8 | B1 | C6/0.03 | — | — | 18 | B | C | A |
| Example 7 | 0.8 | B1 | C7/0.03 | — | — | 17 | B | C | A |
| Example 8 | 0.8 | B1 | C8/0.03 | — | — | 19 | B | C | B |
| Example 9 | 0.8 | B1 | C1/0.04 | D1/0.08 | — | 12 | A | A | C |
| Example 10 | 0.8 | B1 | C2/0.04 | D1/0.08 | — | 12 | A | A | C |
| Example 11 | 0.8 | B1 | C3/0.04 | D1/0.08 | — | 18 | A | A | A |
| Example 12 | 0.8 | B1 | C3/0.04 | D2/0.05 | — | 18 | A | A | A |
| Example 13 | 0.8 | B1 | C3/0.04 | D3/0.05 | — | 19 | A | A | A |
| Example 14 | 0.8 | B1 | C4/0.04 | D1/0.08 | — | 17 | A | A | A |
| Example 15 | 0.8 | B1 | C5/0.01 | D1/0.08 | — | 14 | A | A | C |
| Example 16 | 0.8 | B1 | C6/0.03 | D1/0.08 | — | 18 | B | A | A |
| Example 17 | 0.8 | B1 | C7/0.03 | D1/0.08 | — | 17 | B | A | A |
| Example 18 | 0.8 | B1 | C8/0.03 | D1/0.08 | — | 19 | B | A | B |
| Example 19 | 0.8 | B1 | C1/0.04 | D1/0.08 | E1/5 | 12 | A | A | C |
| Example 20 | 0.8 | B1 | C2/0.04 | D1/0.08 | E1/5 | 12 | A | A | C |
| Example 21 | 0.8 | B1 | C3/0.04 | D1/0.08 | E1/5 | 18 | A | A | A |
| Example 22 | 0.8 | B1 | C4/0.04 | D1/0.08 | E1/5 | 18 | A | A | A |
| Example 23 | 0.8 | B1 | C7/0.03 | D1/0.08 | E1/5 | 17 | B | A | A |

From TABLE 1, in the chemical solutions of Examples 1 to 8 in which the compound (C) was blended, compared with the chemical solution of Comparative Example 1 in which the compound (C) was not blended, it is found that the increase in roughness was suppressed.

Further, in the chemical solutions of Examples 1 to 8, the etching rates were good. When further blending the pH buffer component (D), it is found that the rate fluctuation at stirring was suppressed, as shown in Examples 9 to 18.

What is claimed is:

1. A chemical solution for use in cleaning or etching a ruthenium-containing layer, comprising:
   orthoperiodic acid (A);
   a base component (B); and
   a compound (C) selected from the group consisting of a nitrogen-containing heterocyclic compound, an organic phosphonic acid, and an organic carboxylic acid,
   wherein the base component (B) does not correspond to any one of the compound (C), a pH buffer component (D), and an organic amine oxide (E).

2. The chemical solution according to claim 1, wherein the chemical solution has a pH of 8 or more and 10 or less.

3. The chemical solution according to claim 1, further comprising a pH buffer component (D).

4. The chemical solution according to claim 3, wherein the pH buffer component (D) is one or more selected from the group consisting of citrates, acetates, phosphates, borates, carbonates, bicarbonates, and sulfates.

5. The chemical solution according to claim 1, further comprising an organic amine oxide (E).

6. The chemical solution according to claim 1, wherein the compound (C) is a nitrogen-containing heterocyclic compound.

7. The chemical solution according to claim 6, wherein the nitrogen-containing heterocyclic compound is a compound having a triazole ring in a structure thereof.

8. The chemical solution according to claim 6, wherein the nitrogen-containing heterocyclic compound is a compound having a pyridine ring in a structure thereof.

9. The chemical solution according to claim 1, wherein the compound (C) is an organic phosphonic acid.

10. The chemical solution according to claim 1, wherein the compound (C) is an organic carboxylic acid.

11. A method for fabricating ruthenium wiring, comprising:
   forming, on a substrate, an insulating film having a trench;
   forming a ruthenium-containing layer using a ruthenium-containing conductive material so as to fill the trench;
   flattening each of surfaces of the ruthenium-containing layer and the insulating film; and
   forming a recess by etching the flattened surface of the ruthenium-containing layer using the chemical solution according to claim 1.

* * * * *